US012749790B2

(12) United States Patent
Kim et al.

(10) Patent No.: US 12,749,790 B2
(45) Date of Patent: Sep. 29, 2026

(54) ANTENNA APPARATUS

(71) Applicant: KMW INC., Hwaseong-si (KR)

(72) Inventors: Duk Yong Kim, Yongin-si (KR); Kyo Sung Ji, Hwaseong-si (KR); Chi Back Ryu, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 291 days.

(21) Appl. No.: 18/586,468

(22) Filed: Feb. 24, 2024

(65) Prior Publication Data

US 2024/0195043 A1 Jun. 13, 2024

Related U.S. Application Data

(63) Continuation of application No. PCT/KR2022/013063, filed on Aug. 31, 2022.

(30) Foreign Application Priority Data

Aug. 31, 2021 (KR) ........................ 10-2021-0115836
Aug. 31, 2022 (KR) ........................ 10-2022-0110287

(51) Int. Cl.
*H01Q 1/02* (2006.01)
*F21S 8/00* (2006.01)
(Continued)

(52) U.S. Cl.
CPC ................ *H01Q 1/02* (2013.01); *F21S 8/033* (2013.01); *F21V 17/12* (2013.01); *H01Q 1/06* (2013.01);
(Continued)

(58) Field of Classification Search
CPC .. H01Q 1/02; H01Q 1/06; H01Q 1/42; H01Q 1/12; H01Q 1/24; F21S 8/00; F21V 17/12; F21Y 15/10
See application file for complete search history.

(56) References Cited

U.S. PATENT DOCUMENTS 10,044,091 B2 8/2018 DiPiero
12,517,845 B2 * 1/2026 Thiruchengode Vajravel ............. G06F 13/102
(Continued)

FOREIGN PATENT DOCUMENTS

CN 104602369 A 5/2015
EP 4340121 A1 3/2024
(Continued)

OTHER PUBLICATIONS

European Search Report dated Sep. 17, 2025 from European Patent Office for Application No. 22865054.5.
(Continued)

*Primary Examiner* — Thien M Le

(57) ABSTRACT

An antenna apparatus comprises an antenna housing part including a front housing that is particularly made of a thermally conductive material and formed in the shape of an enclosure having an open rear portion, and a rear housing cover that shields the open rear portion of the front housing and forms a predetermined installation space therein; and a main board and a PSU board which are stacked in an installation space of the antenna housing part in such a manner that predetermined heating elements are mounted on the front surface of the main board and the PSU board, and the front surfaces of the predetermined heating elements are in the thermal contact with the front inner surface of the installation space of the antenna housing part.

16 Claims, 19 Drawing Sheets

(a) (b)

(51) Int. Cl.

| | |
|---|---|
| ***F21V 17/12*** | (2006.01) |
| ***H01Q 1/06*** | (2006.01) |
| ***H01Q 1/42*** | (2006.01) |
| ***H05K 7/14*** | (2006.01) |
| *F21Y 115/10* | (2016.01) |

(52) U.S. Cl.

CPC ............. *H01Q 1/42* (2013.01); *H05K 7/1427* (2013.01); *F21Y 2115/10* (2016.08)

(56) References Cited

U.S. PATENT DOCUMENTS

| | | | | |
|---|---|---|---|---|
| 12,537,290 | B2 * | 1/2026 | Kim | H01Q 1/246 |
| 2014/0065996 | A1 | 3/2014 | Dickie et al. | |
| 2018/0219277 | A1 | 8/2018 | Hirata et al. | |
| 2019/0227538 | A1 * | 7/2019 | Lassini | G06F 9/4401 |
| 2021/0297517 | A1 * | 9/2021 | Yim | G09G 3/035 |
| 2022/0069476 | A1 * | 3/2022 | Yoo | H01Q 1/02 |
| 2022/0200125 | A1 * | 6/2022 | Ji | F28F 3/12 |
| 2023/0009333 | A1 * | 1/2023 | Yun | H04B 7/0413 |
| 2023/0345664 | A1 * | 10/2023 | Zanft | H05K 7/20209 |
| 2024/0079755 | A1 * | 3/2024 | Kim | H01Q 1/246 |
| 2024/0372262 | A1 * | 11/2024 | Ma | H01Q 1/52 |
| 2024/0381596 | A1 * | 11/2024 | Hwang | H05K 5/03 |

FOREIGN PATENT DOCUMENTS

| | | | |
|---|---|---|---|
| JP | 2017-046121 | A | 3/2017 |
| JP | 2020-150470 | A | 9/2020 |
| KR | 10-1048636 | B1 | 7/2011 |
| WO | 2016/075923 | A1 | 5/2016 |
| WO | 2020/091329 | A1 | 5/2020 |

OTHER PUBLICATIONS

International Search Report mailed Dec. 1, 2022 for International Application No. PCT /KR2022/013063 and its English translation.
Japanese Office Action mailed Feb. 4, 2025 from Japanese Patent Office for Application No. 2024-512180.

* cited by examiner (a) (b)

ANTENNA APPARATUS

CROSS-REFERENCE TO RELATED APPLICATIONS

This application is a continuation application of International Application No. PCT/KR2022/013063, filed on Aug. 31, 2022, which claims the benefit of Korean Patent Application Nos. 10-2021-0115836, filed Aug. 31, 2021; and 10-2022-0110287, filed Aug. 31, 2022, in the Korean Intellectual Property Office, the disclosures of which are incorporated herein in their entirety by reference.

TECHNICAL FIELD

The present disclosure relates to an antenna apparatus, and more specifically, to an antenna apparatus, which facilitates the installation of an indoor or outdoor wall surface and a support pole by arranging a heat dissipation structure so that heat is intensively dissipated to a front portion of an antenna housing part and removing a rear heat dissipation fin.

BACKGROUND ART

In general, an antenna apparatus includes a main board on which predetermined heating elements are mounted, a plurality of filters stacked at a front of the main board, and an antenna element board (or an antenna element assembly) stacked at fronts of the plurality of filters forward from an inner side of an antenna housing part sequentially in an installation space of the antenna housing part with an open front portion.

Here, a radome for protecting the main board, the plurality of filters, and the plurality of antenna elements disposed by being stacked in the installation space of the antenna housing part may be installed on a front surface of the antenna housing part.

Therefore, an antenna apparatus according to the related art is provided to dissipate most of driving heat generated from the predetermined heating elements mounted on the main board due to the provision of the radome rearward through a plurality of rear heat dissipation fins provided on a rear surface of the antenna housing part.

However, in the antenna apparatus according to the related art, since the plurality of rear heat dissipation fins for dissipating system driving heat to a rear side of the antenna housing part should be formed at the rear side of the antenna housing part, a separation space for air circulation is needed between the rear heat dissipation fin and an installation wall surface, and thus there is a problem that production installation is restricted due to restriction to installation conditions or the like. In addition, in the antenna apparatus according to the related art, since the plurality of rear heat dissipation fins for dissipating the system driving heat to the rear side of the antenna housing part should be formed to integrally protrude rearward from the antenna housing part, an installation space as much as volumes of the rear heat dissipation fins is at least needed, and thus there is a problem of leading to installation restriction to installation wall surfaces of public facilities such as subways.

In addition, even when the system driving heat of the antenna apparatus is dissipated to the front side of the antenna housing part, when the radome, which is an essential component for protecting the antenna element and the like, is provided, a heat dissipation area is restricted as much as an area of the radome, and thus there is a problem that an increase in heat dissipation performance is very restricted inevitably.

Technical Problem

The present disclosure has been made in efforts to solve the problems and is directed to providing an antenna apparatus capable of reducing restriction to an installation space of an indoor or outdoor installation wall surface and a support pole.

In addition, the present disclosure is directed to providing an antenna apparatus capable of removing a configuration of a conventional radome itself restricted to heat dissipation performance and forward heat dissipation through one component of an antenna element assembly.

The objects of the present disclosure are not limited to the above-described objects, and other objects that are not mentioned will be able to be clearly understood by those skilled in the art from the following description.

Technical Solution

An antenna apparatus according to one embodiment of the present disclosure includes an antenna housing part made of a thermally conductive material and including a front housing formed in a shape of an enclosure with an open rear portion and a rear housing cover shielding the open rear portion of the front housing and forming a predetermined installation space therein, a main board and a power supply unit (PSU) board disposed to be stacked in the installation space of the antenna housing part, having a predetermined heating element disposed by being mounted on front surfaces thereof, and stacked so that a front surface of the predetermined heating element is in thermal contact with a front inner surface of the installation space of the antenna housing part, and a plurality of filters disposed to form a predetermined layer in the installation space between rear surfaces of the main board and the PSU board and the rear housing cover.

Here, a plurality of radiation elements configured to enable implementation of beam forming according to double polarization may be exposed to outside air and disposed to form a layer, which differs from the main board, the PSU board, and the plurality of filters, on the front surface of the antenna housing part.

In addition, a plurality of forward heat dissipation fins protruding forward by a predetermined length may be formed integrally on a front surface of the front housing corresponding to the front inner surface of the installation space of the antenna housing part in contact with a front surface of the predetermined heating element.

In addition, the antenna housing part may be fixed via an installation plate provided so that a rear surface of the rear housing cover is installed parallel to an installation wall surface.

In addition, the rear housing cover of the antenna housing part may be formed flat to be in surface contact with the installation plate.

In addition, the installation plate may be formed in a perpendicular panel shape in surface contact with the installation wall surface and made of a thermally conductive material capable of conducting heat transferred from the rear housing cover.

In addition, a fixing groove for an installation wall surface, which is formed to pass through the installation plate in a front-rear direction and allows a head portion of an installation screw previously fixed to the installation wall surface to be inserted by passing through the installation plate when the installation plate moves rearward, and then allows a body portion of the installation screw to be hooked by being inserted in its own weight direction when the installation plate moves downward, may be formed at a plurality of positions of the installation plate.

In addition, the antenna housing part may be fixed via an installation plate provided so that a rear surface of the rear housing cover is installed parallel to a longitudinal direction of a support pole.

In addition, a fixing groove for a support pole, which is formed to pass through the installation plate in a front-rear direction and to which a plurality of hose clamp wires provided to be vertically spaced apart from each other to horizontally surround an outer circumferential surface of the support pole are fastened by being hooked, may be formed at a plurality of positions of the installation plate.

In addition, a left and right antenna hooking part bent to protrude forward may be formed on each of both left and right end portions of the installation plate, a "U"-shaped screw fastening groove with an open upper portion may be formed in each of the left and right antenna hooking parts, and the antenna housing part may be fixed by being hooked by an operation in which an assembly screw is fastened by being inserted into and hooked to a screw fastening groove when fastened to the screw fastening hole of screw fastening parts formed on left and right edge side surface portions of the front housing of the antenna housing part.

In addition, the antenna apparatus may further include a light emitting diode (LED) module coupled to surround a front surface of the antenna housing part and configured to radiate predetermined light from both side surface portions thereof, wherein the LED module may be fastened to the remaining screw fastening holes other than a screw fastening hole to which the installation plate is screw-fastened by the assembly screw by a separate assembly screw.

In addition, the LED module may further include an LED board part on which a plurality of LED elements disposed to extend vertically inside both left and right side surface portions of the LED module are mounted, and an LED guide part disposed vertically inside the both left and right side surface portions of the LED module and configured to prevent light generated from the LED elements from entering a rear side provided with the antenna housing part.

In addition, left and right sides inside upper and lower end portions of the LED module may be provided with a detachable guide part in which a "U"-shaped assembly guide groove open rearward is formed, and a guide screw hole to which a guide screw passing through the detachable guide part is assembled may be formed in upper and lower end portions of the front housing of the antenna housing part.

In addition, an element seating part on which an antenna element assembly including the plurality of radiation elements is seated may be provided flat on a front surface of the front housing of the antenna housing part. In addition, the element seating part may be formed so that a front surface of the front housing of a portion from which the plurality of forward heat dissipation fins are removed is recessed to a predetermined depth and formed to a depth at which an edge end portion of the antenna element assembly is accommodated deeper than front ends of the plurality of forward heat dissipation fins.

In addition, the antenna element assembly may include a printed circuit board for a radiation element coupled in close contact with a front surface of the element seating part, an antenna patch circuit part formed by being printed on a front surface of the printed circuit board for a radiation element, an antenna assembly cover made of a plastic resin material and configured to shield the front surface of the printed circuit board for a radiation element including the antenna patch circuit part, and a plurality of radiation directors made of a thermally conductive material, disposed on a front surface of the antenna assembly cover, and each electrically connected to the antenna patch circuit part through one of a plurality of through holes formed to pass through the antenna assembly cover in a front-rear direction.

Advantageous Effects

According to the antenna apparatus according to one embodiment of the present disclosure, it is possible to achieve various effects as follows.

First, since the rear surface of the antenna housing part is disposed in close contact with the front side of the installation plate and the antenna apparatus may be installed at the rear side of the installation plate to be parallel to the front surface of the installation wall surface or the support pole, it is possible to reduce the restraint to the installation space.

Second, by removing the configuration of the conventional radome itself restricted to the heat dissipation performance and enabling the forward heat dissipation through one component of the antenna element assembly, it is possible to maximize the heat dissipation performance during the forward heat dissipation even without the rearward heat dissipation.

DESCRIPTION OF REFERENCE NUMERALS

Figure 1:
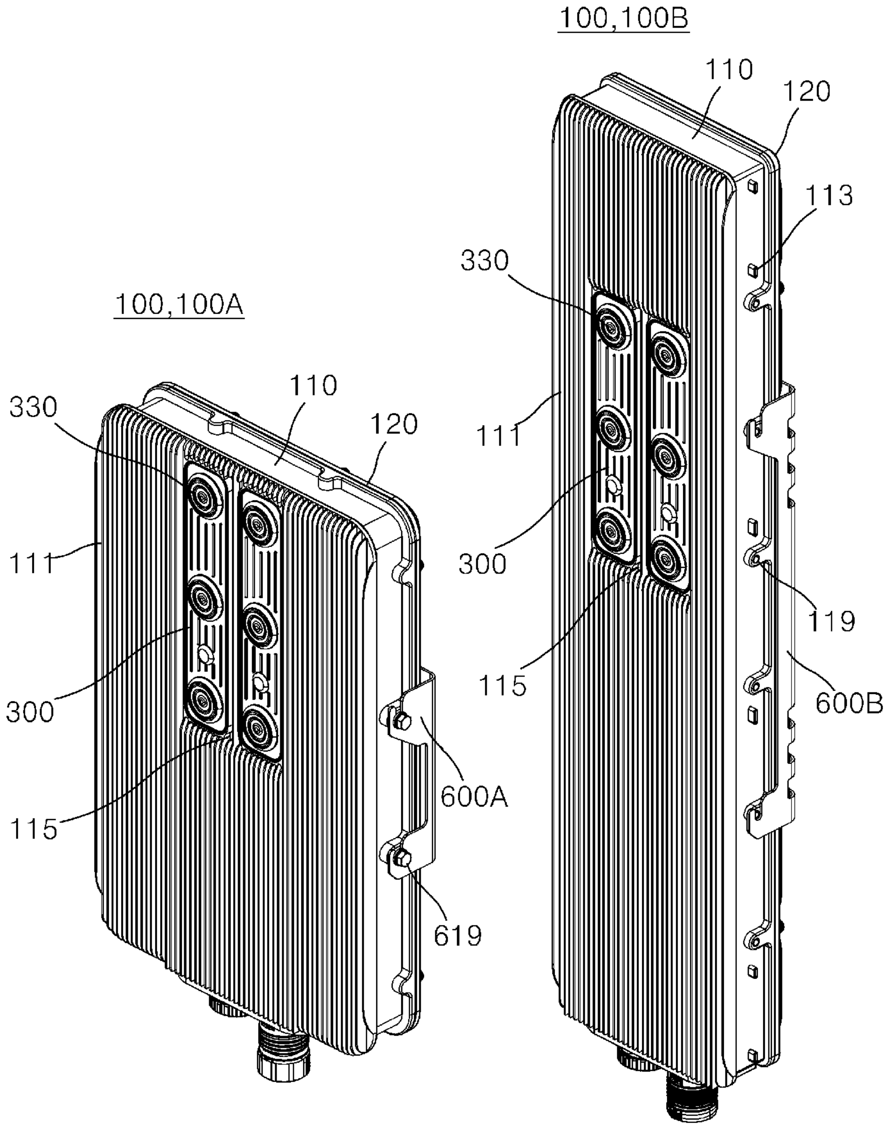
FIG. 1 is a perspective view of various embodiments of an antenna apparatus according to one embodiment of the present invention.

100: antenna apparatus 110, 120: antenna housing part
110: front housing 111: forward heat dissipation fin
115: element seating part 120: rear housing cover
300: antenna element assembly 310: antenna assembly cover
320: printed circuit board for a radiation element
330: director for radiation
350: antenna patch circuit part 351*a* to 351*c*: patch element
410: main board 420: power supply unit (PSU) board
500: filter 600: installation plate

MODE FOR INVENTION

Hereinafter, an antenna apparatus according to one embodiment of the present disclosure will be described in detail with reference to the accompanying drawings.

In adding reference numerals to components in each drawing, it should be noted that the same components have the same reference numerals as much as possible even when they are illustrated in different drawings. In addition, in describing embodiments of the present disclosure, the detailed description of related known configurations or functions will be omitted when it is determined that the detailed description obscures the understanding of the embodiments of the present disclosure.

Terms such as first, second, A, B, (a), and (b) may be used to describe components of the embodiments of the present disclosure. The terms are only for the purpose of distinguishing a component from another, and the nature, sequence, order, or the like of the corresponding component is not limited by the terms. In addition, unless otherwise defined, all terms (including technical and scientific terms) used herein have the same meanings as those commonly understood by those skilled in the art to which the present disclosure pertains. The terms defined in a generally used dictionary should be construed as meanings that match with the meanings of the terms from the context of the related technology and are not construed as an ideal or excessively formal meaning unless clearly defined in this application.

Figure 2:
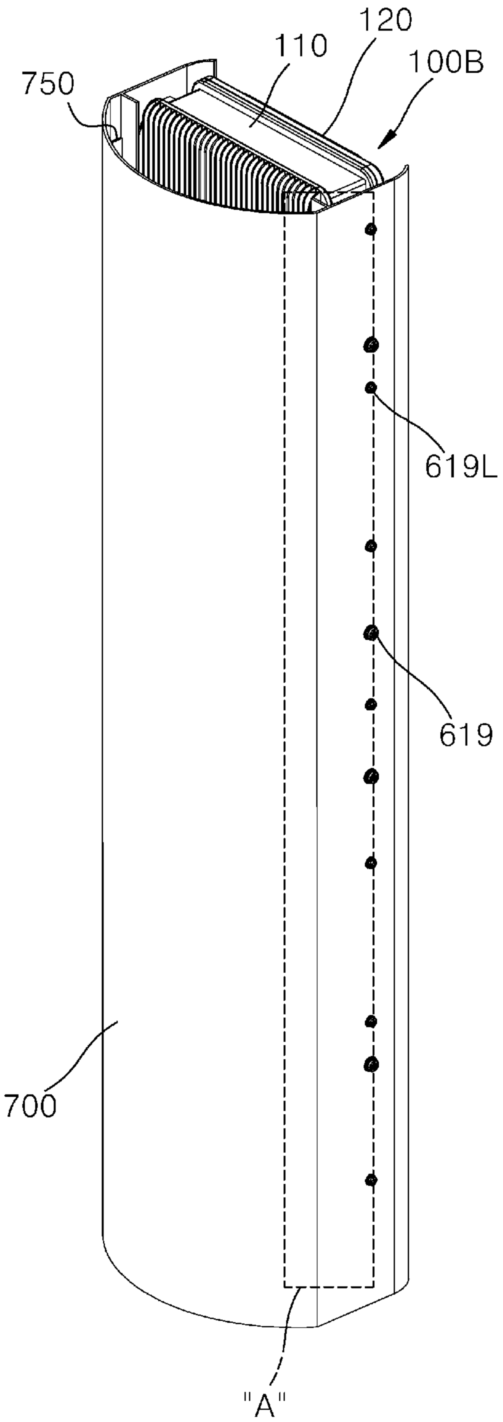
FIG. 2 is a perspective view illustrating a state in which a light emitting diode (LED) module is installed at a front of the antenna apparatus as a second embodiment among the embodiments of FIG. 1.
Figure 3A:
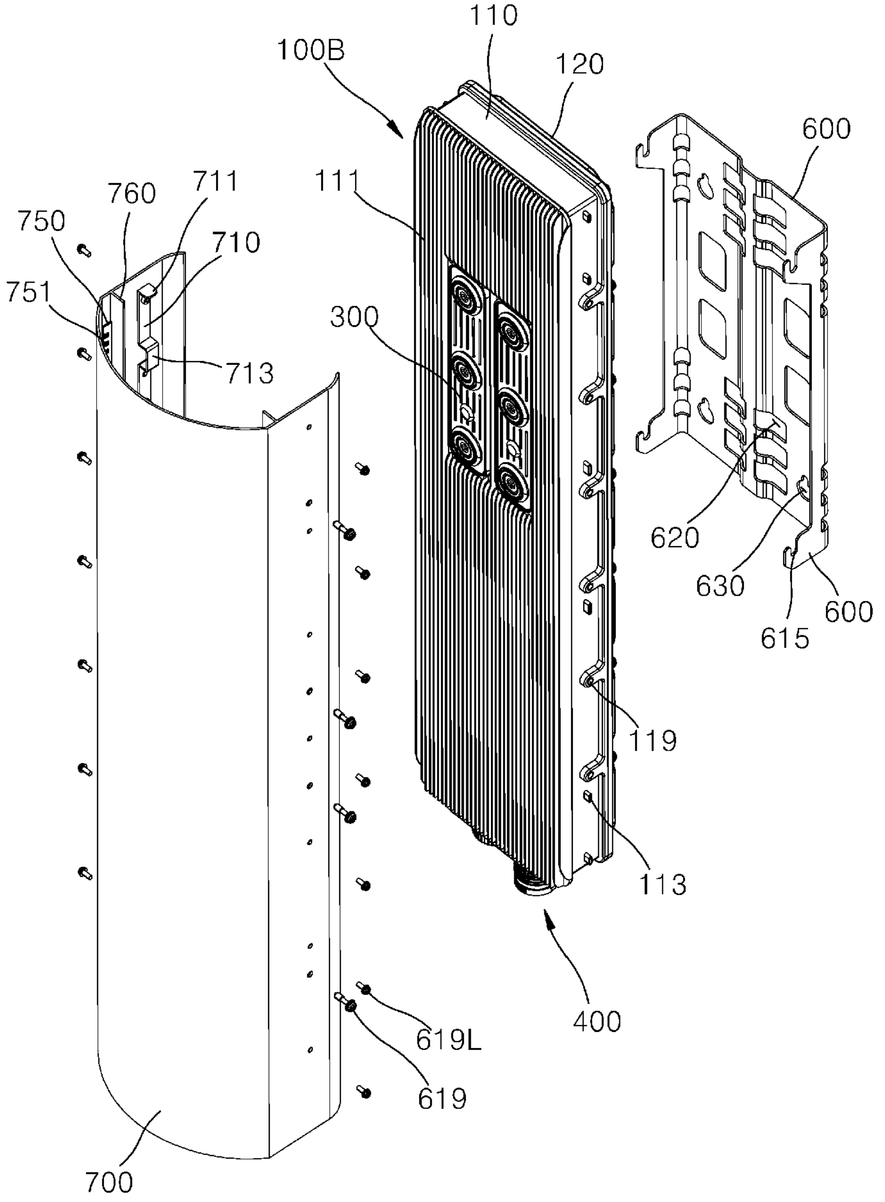
FIGS. 3A and 3B are exploded perspective views of a front portion and rear portion of FIG. 2.
Figure 3B:
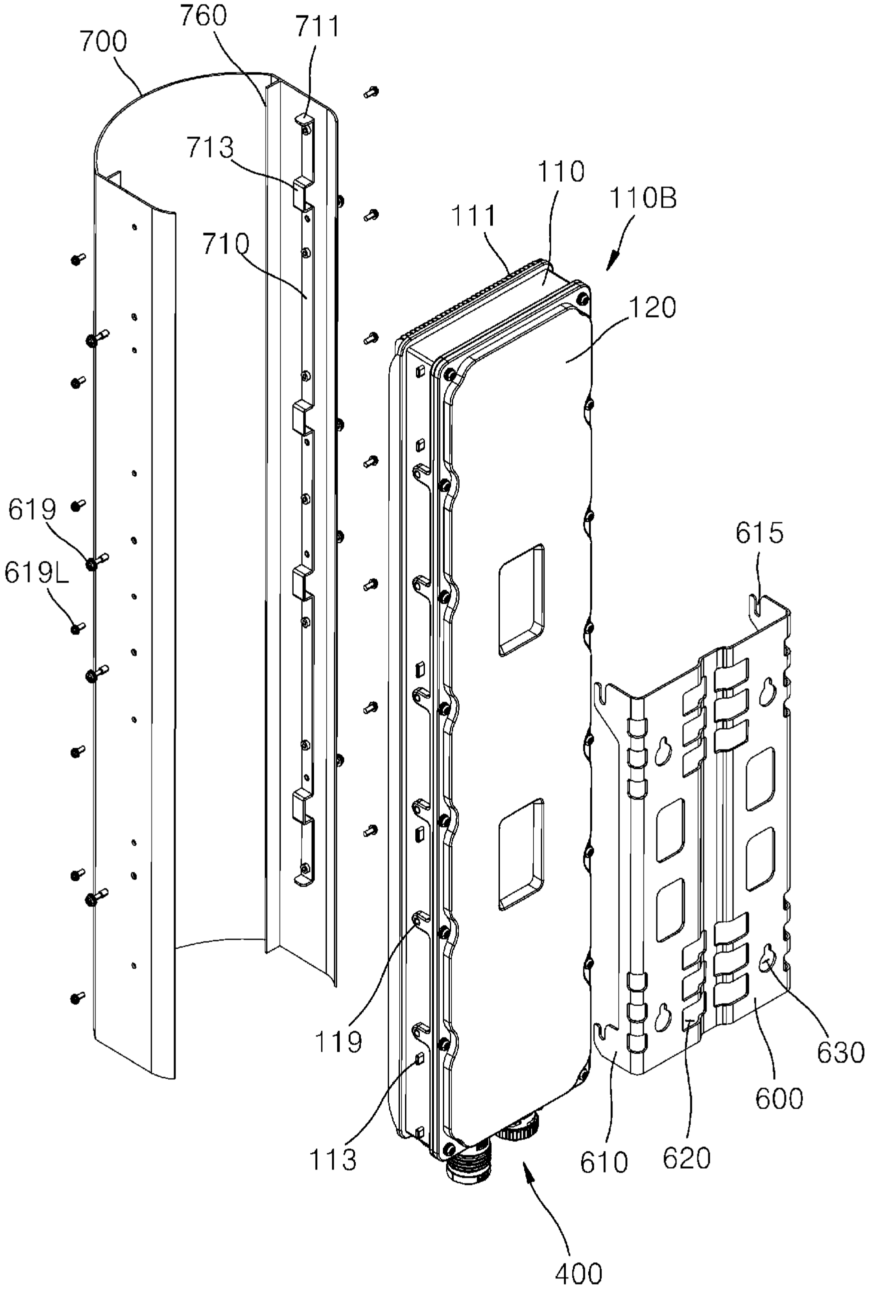
Figure 4:
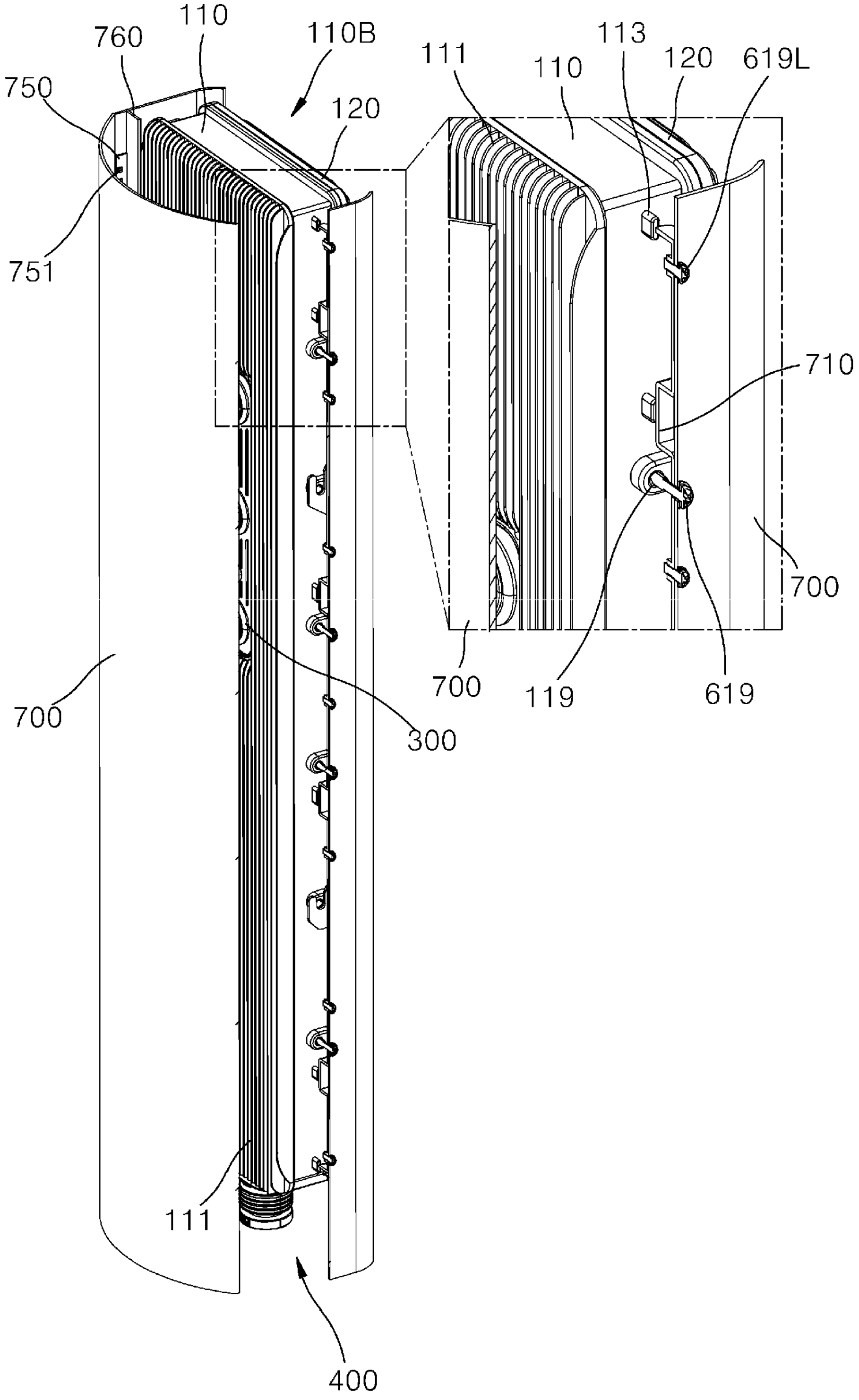
FIG. 4 is a cutout perspective view along line A-A in FIG. 2 and an enlarged view of the cut portion.
Figure 5:
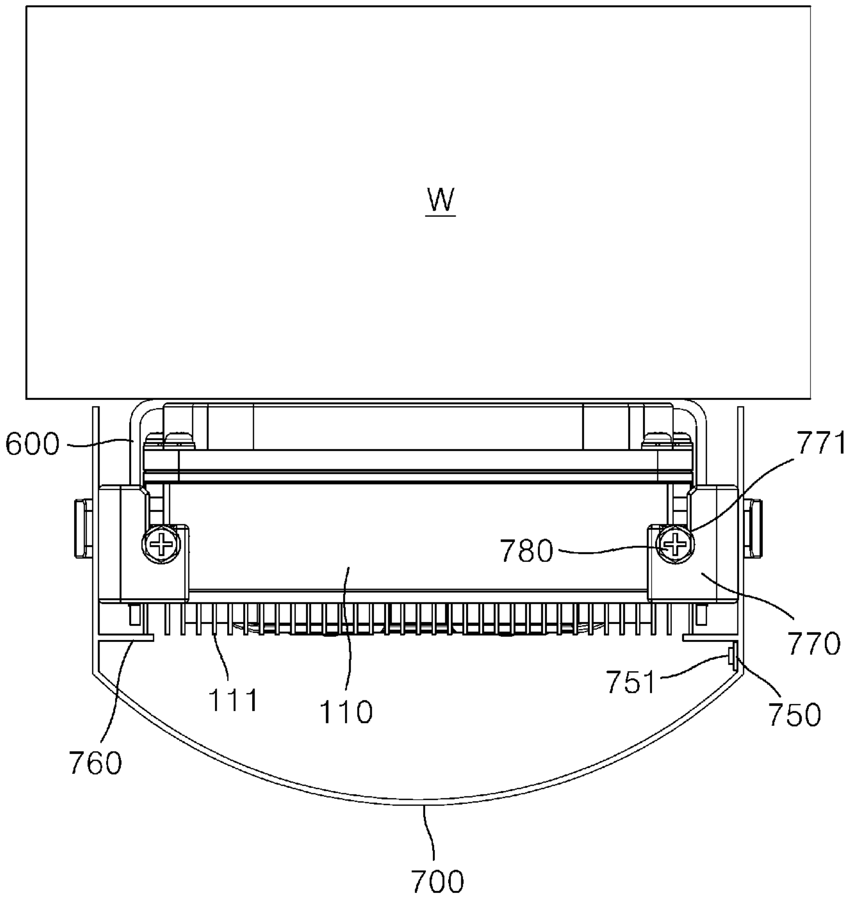
FIG. 5 is a plan view of the antenna apparatus of FIG. 2.

FIG. 1 is a perspective view of various embodiments of an antenna apparatus according to one embodiment of the present invention, FIG. 2 is a perspective view illustrating a state in which a light emitting diode (LED) module is installed at a front of the antenna apparatus as a second embodiment among the embodiments of FIG. 1, FIGS. 3A and 3B are exploded perspective views of a front portion and rear portion of FIG. 2, FIG. 4 is a cutout perspective view along line A-A in FIG. 2 and an enlarged view of the cut portion, and FIG. 5 is a plan view of the antenna apparatus of FIG. 2.

As illustrated in FIGS. 1 to 5, an antenna apparatus 100 according to one embodiment of the present disclosure includes an antenna housing part 110 and 120 having an installation space provided therein, a main board 410 and a power supply unit (PSU) board 420 stacked in the installation spaces of the antenna housing part 110 and 120, and a plurality of filters 500 disposed on the installation spaces to form a predetermined layer which is different from the main board 410 and the PSU board 420.

In the antenna apparatus 100 according to one embodiment of the present disclosure, as illustrated in FIGS. 1 to 5, the antenna housing part 110 and 120 may include the front housing 110 which is made of a thermally conductive material, formed in a shape of an enclosure having an open rear portion, has a predetermined installation space formed therein, and has a plurality of forward heat dissipation fins 111 protruding to at least one side of a front surface thereof by a predetermined length and an element seating part 115 in which an antenna element assembly 300 including a plurality of radiation elements is seated on a front surface from which some of the plurality of forward heat dissipation fins 111 are removed provided flat, and the rear housing cover 120 provided to shield the open rear portion of the front housing 110.

Here, the main board 410 and the PSU board 420 may be disposed to be stacked in an installation space 110*s* of the antenna housing part 110 and 120 and disposed to be stacked so that a predetermined heating element is disposed to be mounted on a front surface thereof and a front surface of the predetermined heating element is in thermal contact with a front inner surface of the installation space of the antenna housing part 110 and 120 (in particular, the front housing 110) provided with the plurality of forward heat dissipation fins 111.

In addition, the plurality of filters 500 may have a predetermined layer formed behind the main board 410 and the PSU board 420, and pass through between the main board 410 and the PSU board 420 and may be electrically connected to the antenna element assembly 300.

Although not illustrated, the conventional antenna apparatus has been provided to allow most heat to be dissipated rearward from the antenna housing part by intensively mounting a heating element with a generally large heating amount on a rear portion of the main board or the PSU board and arranging a filter between the antenna element assembly and the main board or the PSU board. In addition, generally, the filter on the installation space is mostly disposed between the main board or PSU board disposed behind the filter and the antenna element assembly disposed in front of the filter for the shortest connection of electrical signals.

However, since the above-described conventional arrangement structure necessarily requires the installation of the radome to protect the front of the antenna element assembly, which is the most important factor in the antenna apparatus, there has been a limitation that the intensive heat dissipation structure for the rear of the antenna housing part 110 and 120 should be inevitably adopted for smooth system heat dissipation of internal heat.

In order to solve the conventional problems at once, a technical feature of the antenna apparatus 100 according to one embodiment of the present disclosure is that the antenna element assembly 300 is exposed to front outside air and designed and manufactured so that no additional installation of the radome is required, while the arrangement of the filter 500 on the installation space of the antenna housing part 110 and 120 is also designed to enable or be advantageous for forward heat dissipation of the heating elements installed on the main board 410 or the PSU board 420.

For reference, the main board 410 may correspond to a board part 400 on which one layer is formed on an inner surface of the antenna housing part 110 and 120 together with the PSU board 420 to be described below.

Here, the plurality of forward heat dissipation fins 111 are formed integrally with the front housing 110 so that the plurality of forward heat dissipation fins 111 protrudes forward by a predetermined length from the front surface of the front housing 110 of the antenna housing part 110 and 120 and serves to increase a heat transfer surface area of the front surface of the front housing 110 made of a thermally conductive material (e.g., a metal material).

In addition, the rear housing cover 120 of the antenna housing part 110 and 120 may be disposed to shield the open rear portion of the front housing 110, made of a thermally conductive material (e.g., a metal material), and may transfer heat in the installation space between the front housing 110 and the rear housing cover 120 rearward. However, the rear housing cover 120 differs from the front housing 110 in that the rear housing cover 120 is disposed in surface contact with or parallel to a front surface of the installation plate 600 to be described below and is not formed with a component such as the plurality of forward heat dissipation fins. Therefore, it may be understood that heat transferred through the rear housing cover 120 is limited to dissipating heat to the outside via only the installation plate 600 in surface contact with the rear housing cover 120.

In other words, unlike the antenna apparatus according to the related art, a rear surface of the rear housing cover 120 is not provided with rearward heat dissipation fins for heat dissipation and may be formed to have only a perpendicular surface in surface contact with the front surface of the installation plate 600. However, the formation of the rearward heat dissipation fins on the rear surface of the rear housing cover 120 is not necessarily, completely precluded, and when the rear housing cover 120 is disposed in parallel to be separated from the installation plate 600, it goes without saying that the rearward heat dissipation fins may be additionally formed.

Meanwhile, there is a difference in that an antenna apparatus 100A (see FIG. 1A) according to a first embodiment and an antenna apparatus 100B (see FIG. 1B) according to a second embodiment of the antenna apparatus 100 according to one embodiment of the present disclosure are embodiments in which the antenna apparatuses have different horizontal widths or vertical lengths according to the optimal shapes and sizes of the main board 410 and the PSU board 420 stacked inside the installation space of the antenna housing part 110 and 120 and the plurality of filters 500.

The use aspect of the antenna apparatus 100A (see FIG. 1A) according to the first embodiment and the antenna apparatus 100B (see FIG. 1B) according to the second embodiment is a matter to be applied by being appropriately selected by a worker according to a surrounding environment to be installed, and widths and sizes in a longitudinal direction thereof should be not restricted. However, when the overall directivity adjustment by tilting adjustment in a front-rear direction and steering adjustment in a left-right direction is required after the antenna apparatus 100 according to one embodiment of the present disclosure is installed, a vertical length may become only a restriction factor during tilting rotation, and a length of the width may become only a restriction factor during steering rotation.

Meanwhile, as illustrated in FIGS. 2 to 5, the antenna apparatus 100 according to one embodiment of the present disclosure may further include a light emitting diode (LED) module 700 coupled to surround the front surface of the antenna housing part 110 and 120 and for radiating predetermined light from both side surfaces thereof.

Here, the LED module 700 may be provided to be fastened to the remaining screw fastening holes 119 other than the screw fastening hole 119 to which the installation plate 600 is screw-fastened by an assembly screw 619 by a separate assembly screw 619L.

The LED module 700 may be coupled to surround the front surface of the antenna housing part 110 and 120 and provided to vertically pass through the antenna housing part 110 and 120, thereby preventing the antenna element assembly 300 and the plurality of forward heat dissipation fins 111 disposed on the front surface of the front housing 110 of the antenna housing part 110 and 120 to be exposed to the outside air from being shielded with the outside air to enable sufficient heat exchange with the outside air, and may be made of the same material as that of the conventional radome, thereby minimizing negative effects on the generation of radiation beams from the antenna element assembly 300.

Meanwhile, as illustrated in FIGS. 3A and 3B, the LED module 700 may further include an LED board part 750 on which a plurality of LED elements 751 disposed to vertically extend inside both left and right side surfaces of the LED module 700 are mounted, and an LED guide part 760 vertically disposed inside the both left and right side surfaces of the LED module 700 and for preventing light generated from the LED elements 751 from entering a rear side provided with the antenna housing part 110 and 120.

In addition, a rigidity reinforcement part 710 for reinforcing the rigidity of the LED module 700 made of a relatively flexible material may be coupled to inner sides of the both left and right side surfaces of the LED module 700.

The rigidity reinforcement part 710 may be coupled to the inner sides of the both left and right side surfaces of the LED module 700 through the screw-fastening of the plurality of fixing screws 619L.

The light generated from the LED elements 751 of the LED module 700 may serve to improve the esthetic sense by being subtly exposed to observers (citizens or users) forward.

In particular, the rigidity reinforcement part 710 may include uneven parts 711 and 713 of which upper and lower ends are formed to protrude inward toward left and right side surface portions of the front housing 110 by a predetermined length, and the uneven parts 711 and 713 may serve to stably support the LED module 700 by being supported by supports 113 protruding outward from each of the left and right side surface portions of the front housing 110 by a predetermined length.

Meanwhile, the element seating part 115 in which the antenna element assembly 300 to be described below is coupled by being accommodated may be formed flat on the front surface of the front housing 110.

The element seating part 115 may have a shape corresponding to an exterior of the antenna element assembly 300, and more specifically, the front surface of the front housing 110 of a portion from which the plurality of forward heat dissipation fins 111 are removed may be formed to be recessed rearward by a predetermined depth and formed to a depth at which an edge end portion of the antenna element assembly 300 is accommodated deeper than front ends of the plurality of forward heat dissipation fins 111.

Meanwhile, the plurality of forward heat dissipation fins 111 may be formed on the entirety of the front surface of the front housing 110 except for the portion on which the element seating part 115 is formed.

As described above, the antenna apparatus 100 according to one embodiment of the present disclosure is provided to dissipate the system heat generated from the heating elements mounted on the main board 410 forward using the plurality of forward heat dissipation fins 111 formed to protrude forward from the front housing 110 of the antenna housing part 110 and 120 and thus has an advantage that the installation of the antenna apparatus 100 can be easily installed even when the installation space of an installation wall surface W or support pole P is narrow.

More specifically, the installation plate 600 is a component for mediating the installation on the installation wall surface W or support pole P of the antenna housing part 110 and 120 and may be firmly installed on the installation wall surface W or support pole P in advance using a fastening member (not illustrated).

In addition, the antenna housing part 110 and 112 may be fixed by being hooked by an operation in which left and right antenna hooking parts 610 bent to protrude forward are formed on both left and right end portions of the installation plate 600, a U-shaped screw fastening groove 615 with an open upper portion is formed on each of upper and lower portions of the left and right antenna hooking part 610, the assembly screws 619 fastened to left and right edge portions of the front housing 110 of the antenna housing part 110 and 112 are fastened by being inserted and hooked into the screw fastening groove 615.

Here, the installation plate 600 may be formed in a perpendicular panel shape in surface contact with the installation wall surface W and made of a thermally conductive material (e.g., a metal material). In this case, since the rear surface of the installation plate 600 may be formed in surface contact with the installation wall surface W, it is possible to not only minimally reduce a space between the rear surface of the rear housing cover 120 of the antenna housing part 110 and 120 and the installation wall surface W, but also easily transfer (dissipate) the heat transferred through the perpendicular surface of the rear housing cover 120 rearward by the thermally conductive material. In this case, a heat transfer medium panel (not illustrated) or the like may be provided between the rear surface of the rear housing cover 120 and the installation plate 600.

Meanwhile, as illustrated in FIG. 5, a detachable guide part 770 in which a “U”-shaped assembly groove 771 open rearward is formed may be further provided at each of left and right sides inside the upper and lower end portions of the LED module 700.

In addition, although not illustrated, a guide screw hole (not illustrated) to which a guide screw 780 passing through the detachable guide part 770 is assembled may be further formed on the upper and lower end portions of the front housing 110 of the antenna housing part 110 and 120.

Here, the guide screw 780 may be coupled to the antenna housing part 110 and 120 side on each of the upper portion or lower portion of the front housing 110 of the antenna housing part 110 and 120 and may install the LED module 700 on the front housing 110 by an operation fastened to a guide screw hole exposed through the assembly guide groove 771 during this process.

In order to conveniently couple the LED module 700 to the front housing 110, an assembler may couple the LED module 700 by an operation of completely fastening the guide screw 780 at a right position by temporarily fastening the guide screw 780 to the guide fastening hole in advance before assembling the LED module 700 and then allowing a body portion of the temporarily fastened guide screw 780 to be inserted into the assembly guide groove 771.

Conversely, in order to conveniently separate the LED module 700 from the front housing 110, the assembler may loosely loosen the guide screw 780 to prevent the guide screw 780 from being separated completely, and then stably separate the guide screw 780 through the guide in a front-rear direction of the body portion of the guide screw 780 and the assembly guide groove 771.

In particular, although not illustrated in the drawings, when a power supply terminal for the LED module 700 is provided to be detachably connected through the antenna housing part 110 and 120, by separating a portion of the LED module 700 forward rather than completely separating the corresponding portion of the LED module 700 and then separating the power supply terminal, it is possible to prevent a post-failure of the power supply terminal.

Figure 6A:
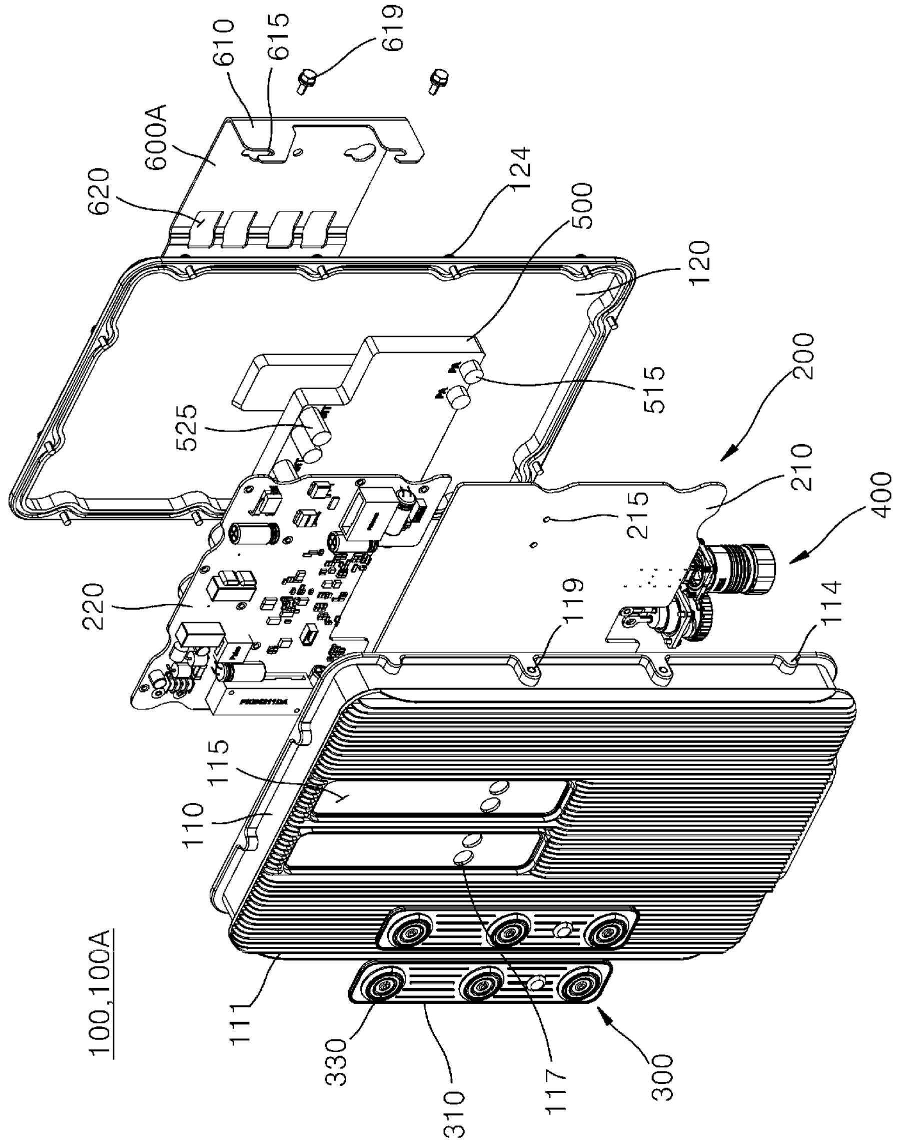
FIGS. 6A and 6B are exploded perspective views of a front portion and rear portion of an antenna apparatus according to a first embodiment among the embodiments of FIG. 1.
Figure 6B:
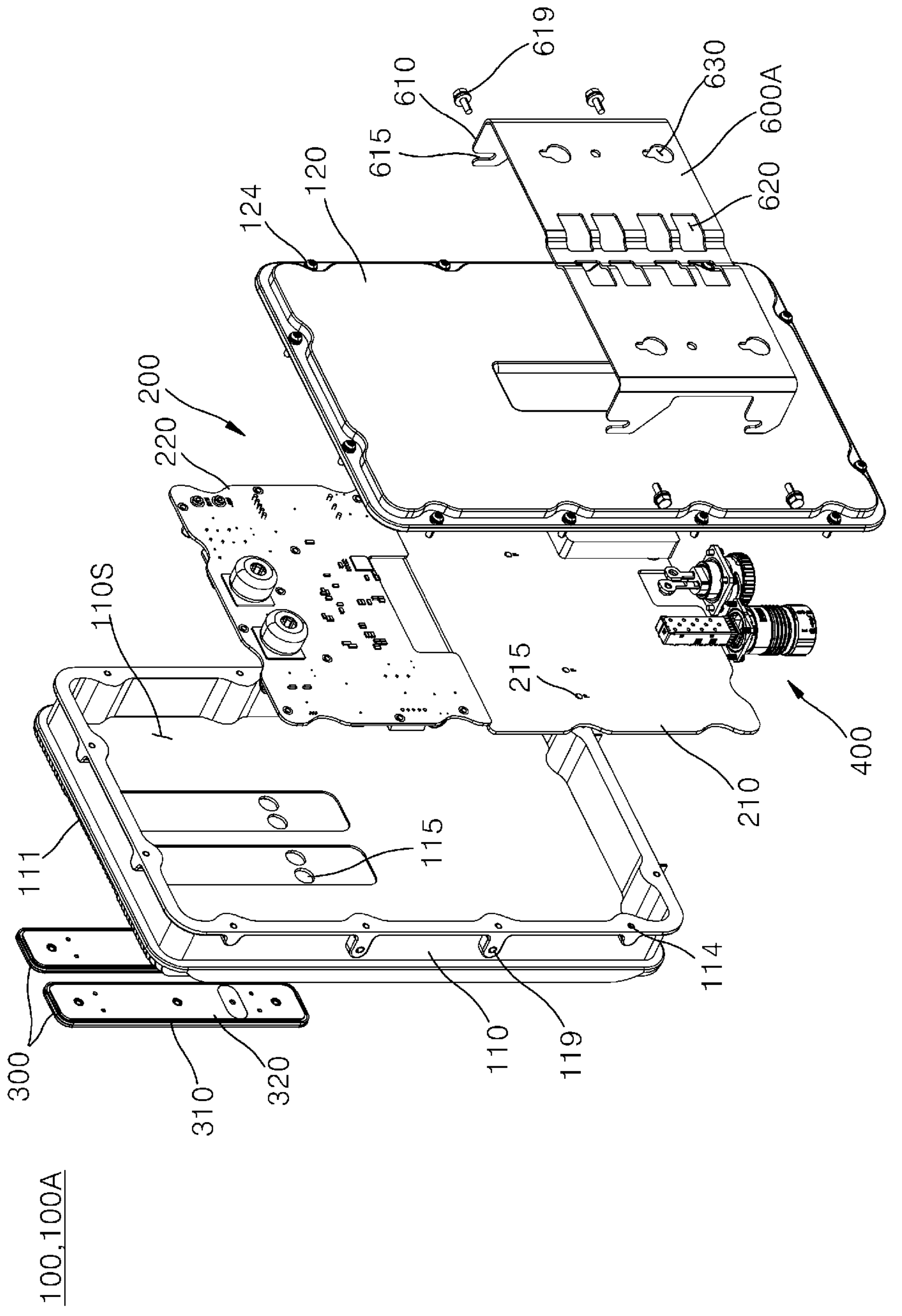
Figure 7A:
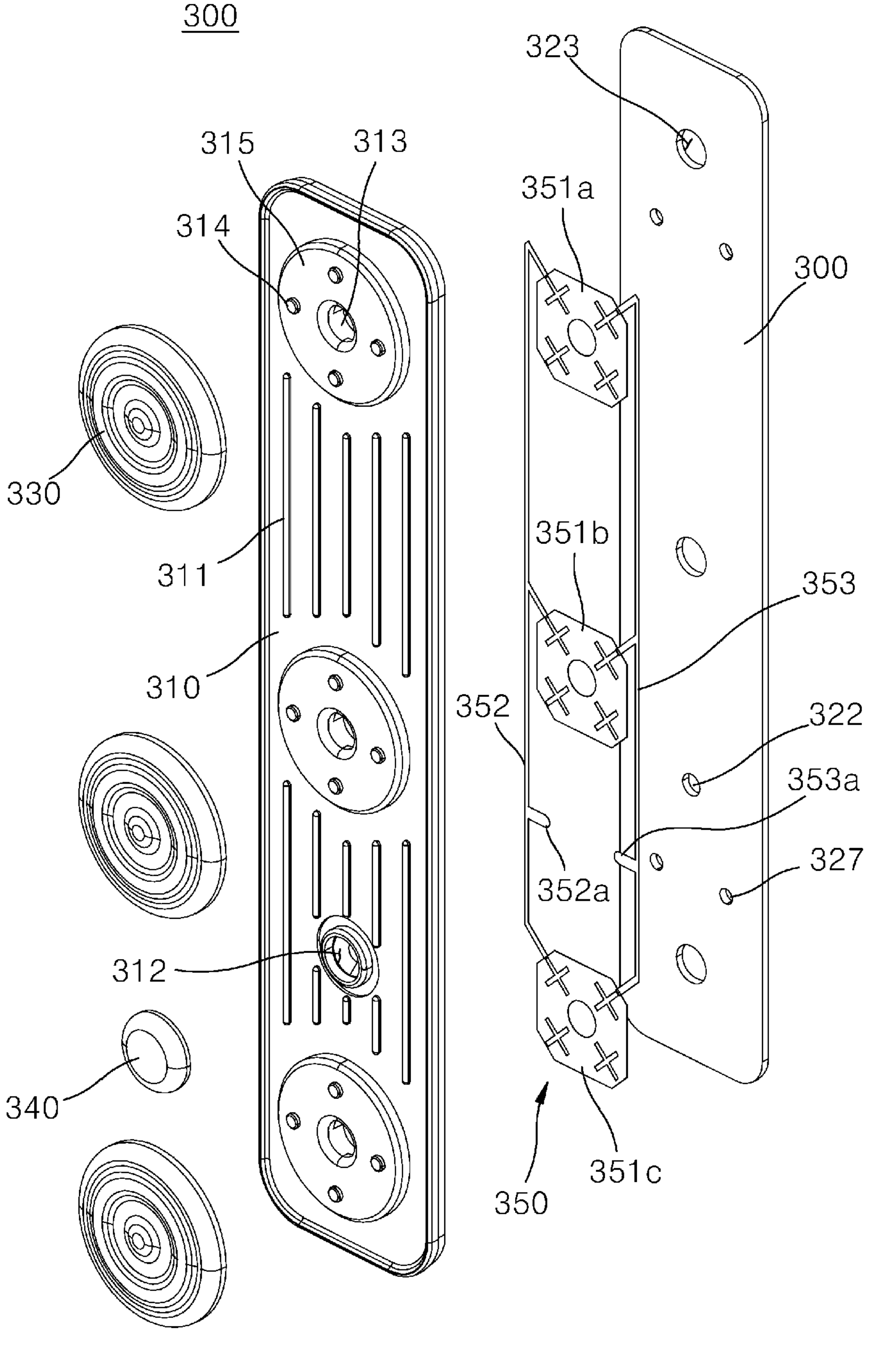
FIGS. 7A and 7B are exploded perspective views of a front portion and rear portion of an antenna element assembly of the configuration of FIG. 1.
Figure 7B:
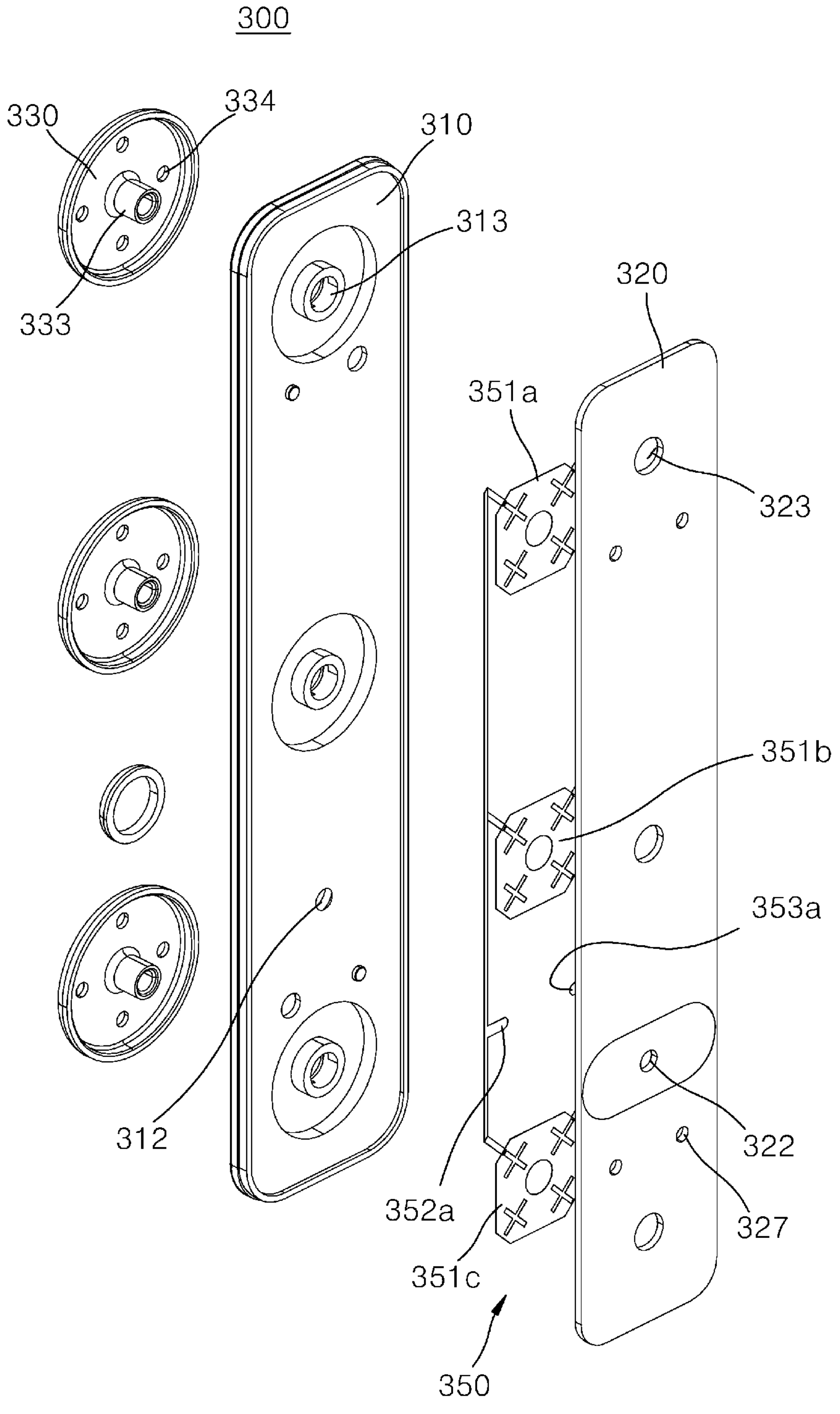
Figure 8:
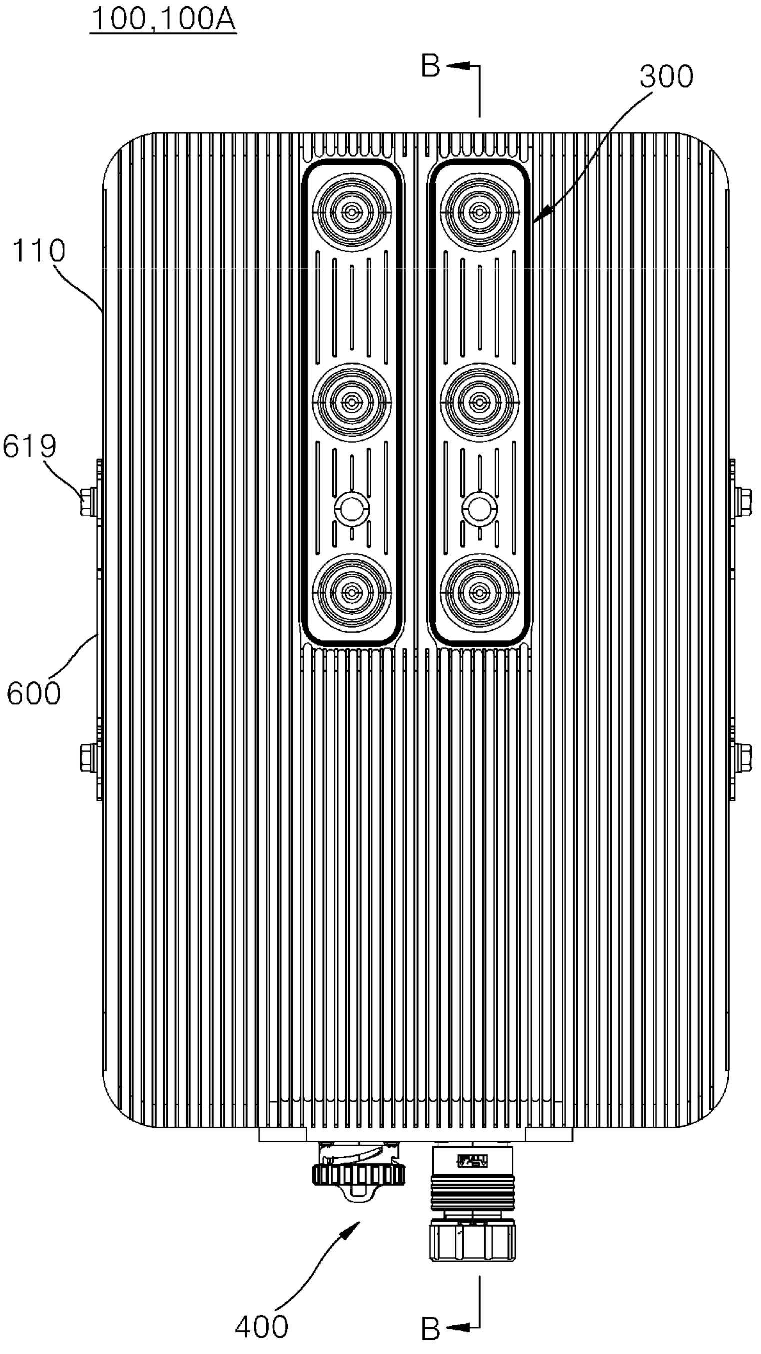
FIG. 8 is a front view of the antenna apparatus according to the first embodiment among the embodiments of FIG. 1.
Figures 9A, 9B:
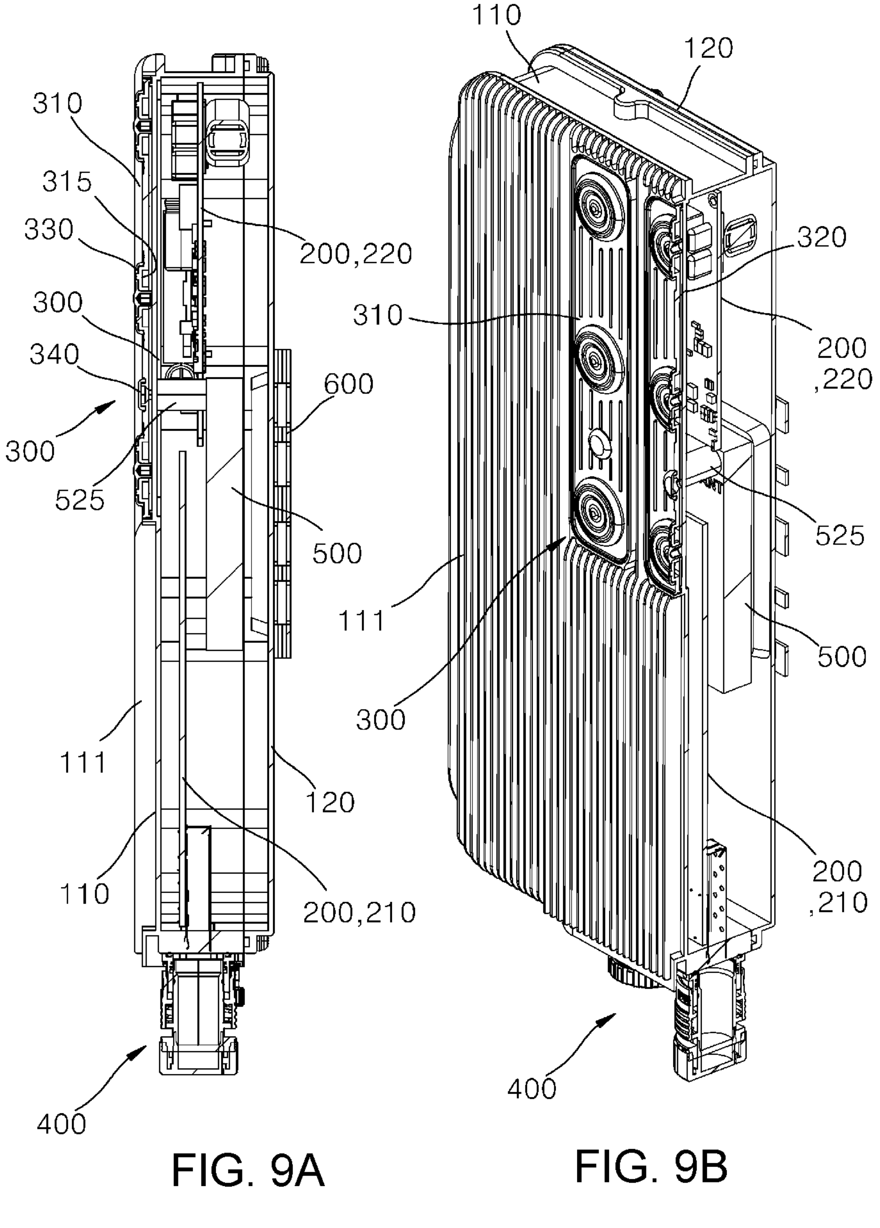
FIG. 9A is a cross-sectional view along line B-B in FIG. 8.
FIG. 9B is a cutout perspective view.

FIGS. 6A and 6B are exploded perspective views of a front portion and rear portion of an antenna apparatus according to a first embodiment among the embodiments of FIG. 1, FIGS. 7A and 7B are exploded perspective views of a front portion and rear portion of an antenna element assembly of the configuration of FIG. 1, FIG. 8 is a front view of the antenna apparatus according to the first embodiment among the embodiments of FIG. 1, and FIG. 9A is a cross-sectional view along line B-B in FIG. 8, and FIG. 9B is a cutout perspective view.

As illustrated in FIGS. 6A to 7B, the antenna element assembly 300 may be installed to be accommodated in at least one element seating part 115 formed on the front surface of the front housing 110.

More specifically, as illustrated in FIGS. 7A and 7B, the antenna element assembly 300 may include a printed circuit board 320 for a radiation element coupled in close contact with the front surface of the element seating part 115, an antenna patch circuit part 350 formed by being printed on a front surface of the printed circuit board 320 for a radiation element, an antenna assembly cover 310 in close contact with the front surface of the printed circuit board 320 for a radiation element, which is made of a plastic resin material and includes the antenna patch circuit part 350, and a plurality of radiation directors 330 made of a thermally conductive material, disposed on a front surface of the antenna assembly cover 310, and each electrically connected to the antenna patch circuit part 350 through one of the plurality of through holes formed to pass through the antenna assembly cover 310 in a front-rear direction.

As illustrated in FIGS. 7A and 7B, the antenna patch circuit part 350 may include a plurality of patch element parts 351*a*, 351*b*, and 351*c* provided to enable beam radiation of double polarization, disposed to be spaced apart from each other in a vertical direction, and a one-side feeding line 352 and the other-side feeding line 353 for supplying electrical signals to each of the patch element parts 351*a*, 351*b*, and 351*c*.

Input terminals 352*a* and 353*a* electrically connected to any one of the main board 410 or the PSU board 420 provided in the installation space inside the antenna housing part 110 and 120 may be formed integrally on the one-side feeding line 352 and the other-side feeding line 353.

Each of the input terminals 352*a* and 353*a* may be disposed to extend to the inside of the installation space through a terminal connecting hole 237 formed to pass through the printed circuit board 320 for a radiation element in the front-rear direction.

Here, as illustrated in FIG. 7B, since the plurality of radiation directors 330 may be assembled to an installation boss 333 formed to protrude rearward from the center thereof through an assembly screw (not illustrated) made of a thermally conductive material and provided so that the assembly screw is in thermal contact with the element seating part 115 made of a thermally conductive material to allow the system heat generated from the inside of the antenna housing part 110 and 120 to be dissipated forward via the radiation directors 330, which are one component of the antenna element assembly 300, as well as the plurality of forward heat dissipation fins 111 of the front housing 110, there is an advantage in that it is possible to greatly improve the overall heat dissipation performance.

The installation boss 333 of the radiation director 330 may be installed to pass through the screw through hole 313 formed in the antenna assembly cover 310 and then assembled through the assembly screw.

Meanwhile, although the plurality of filters 500 is generally disposed between the layer on which the main board 410 and the PSU board 420 are formed and the antenna element assembly 300, in the one embodiment of the present disclosure, the plurality of filters 500 are preferably disposed to be stacked behind the layer on which the main board 410 and the PSU board 420 are formed in that the plurality of heating elements mounted on the front surfaces of the main board 410 and the PSU board 420 are disposed in direct surface thermal contact with the front surface inside the front housing 110.

Therefore, as illustrated in FIGS. 6A and 6B, in the plurality of filters 500, it is preferable that positions of an input port 515 and an output port 525 formed on each of unit filters are designed to be positions at which an input and output of the electrical signal from the main board 410 are easy or positions at which electrical signal connection with the antenna element assembly 300 is easy.

Here, the output ports 525 of the plurality of filters 500 may pass through a terminal installation hole 117 formed in the element seating part 115 of the front housing 110 of the antenna housing part 110 and 120 and may be connected to each of the input terminals 352*a* and 353*a* through an output port hole 322 of the printed circuit board 320 for a radiation element.

Meanwhile, the PSU board 420 disposed to form the same layer and provided with a PSU element (not illustrated) for supplying predetermined power to the plurality of filters 500 and the heating element side of the main board 410 and the like may be provided under the main board 410.

Here, the plurality of filters 500 may be electrically connected to the antenna element assembly 300 disposed on the front surface of the front housing 110 through an empty space between the main board 410 and the PSU board 420. To this end, the front housing 110 may be provided with the terminal installation hole 117 passing therethrough in the front-rear direction and electrically connected via a direct coaxial connector installed in the terminal installation hole 117.

Meanwhile, the heating element mounted on the main board 410 may have a front surface mounted in surface thermal contact with a rear surface corresponding to the remainder other than the element seating part 115 of the front housing. Here, the heating element may include a field programmable gate array (FPGA) element or at least one of a transmission (Tx) element and low noise amplifier (LNA) element.

Figure 10A:
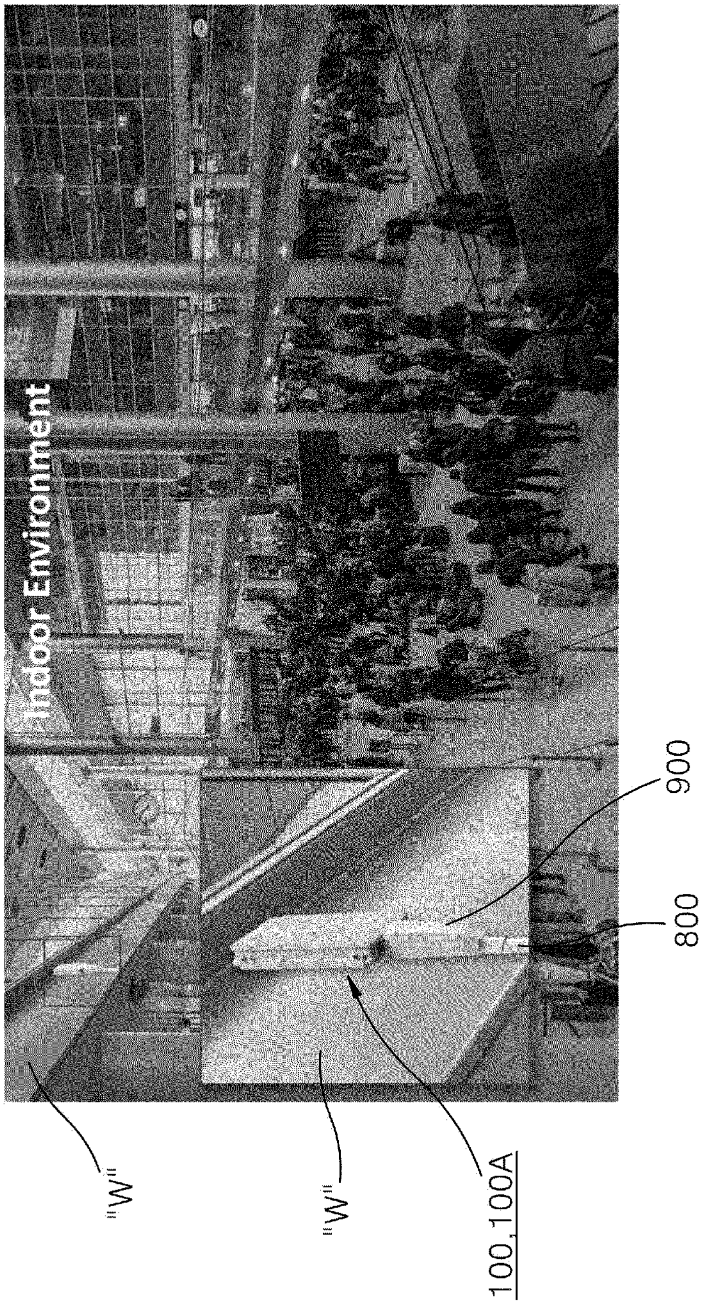
FIGS. 10A to 10C are pictures illustrating various installation examples of the antenna apparatus according to one embodiment of the present disclosure.
Figure 10B:
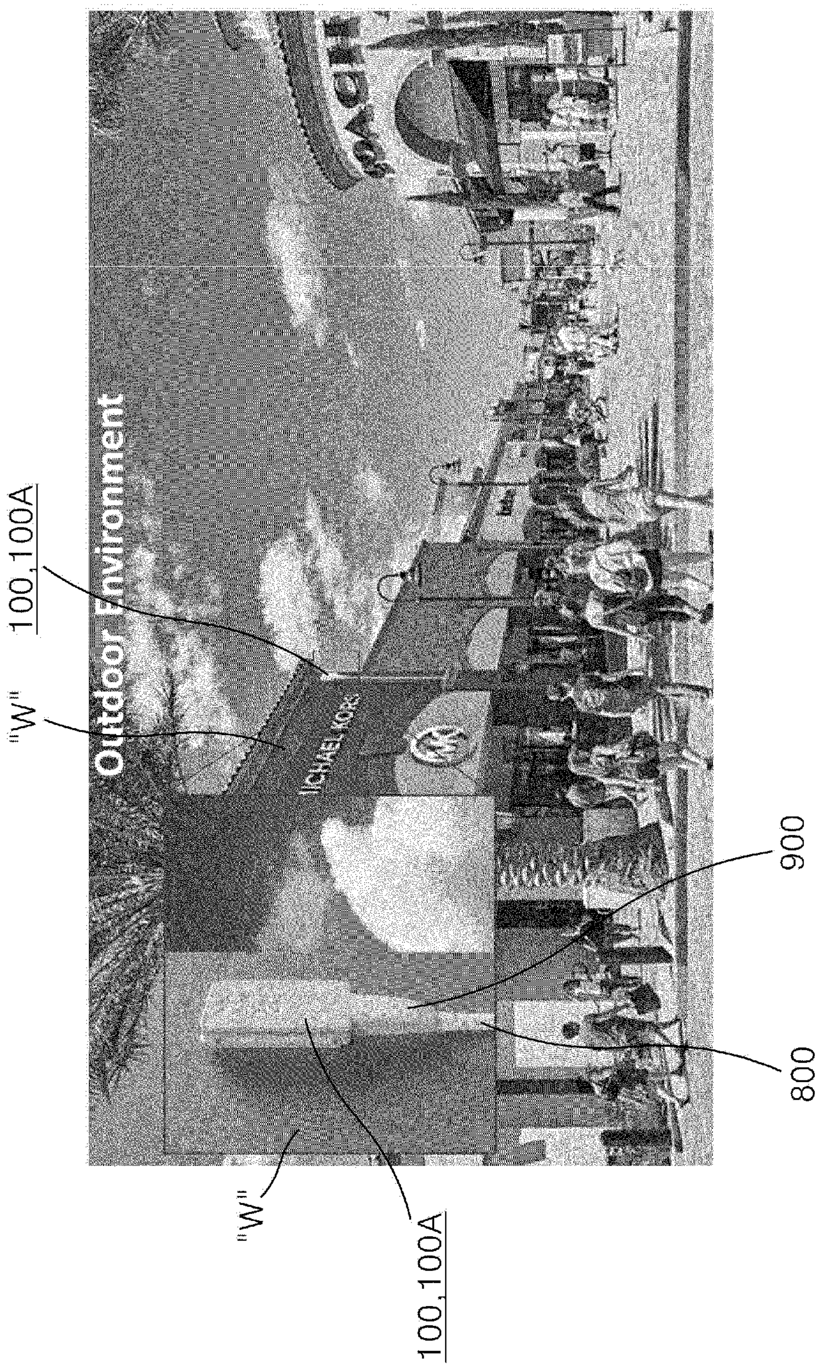
Figure 10C:
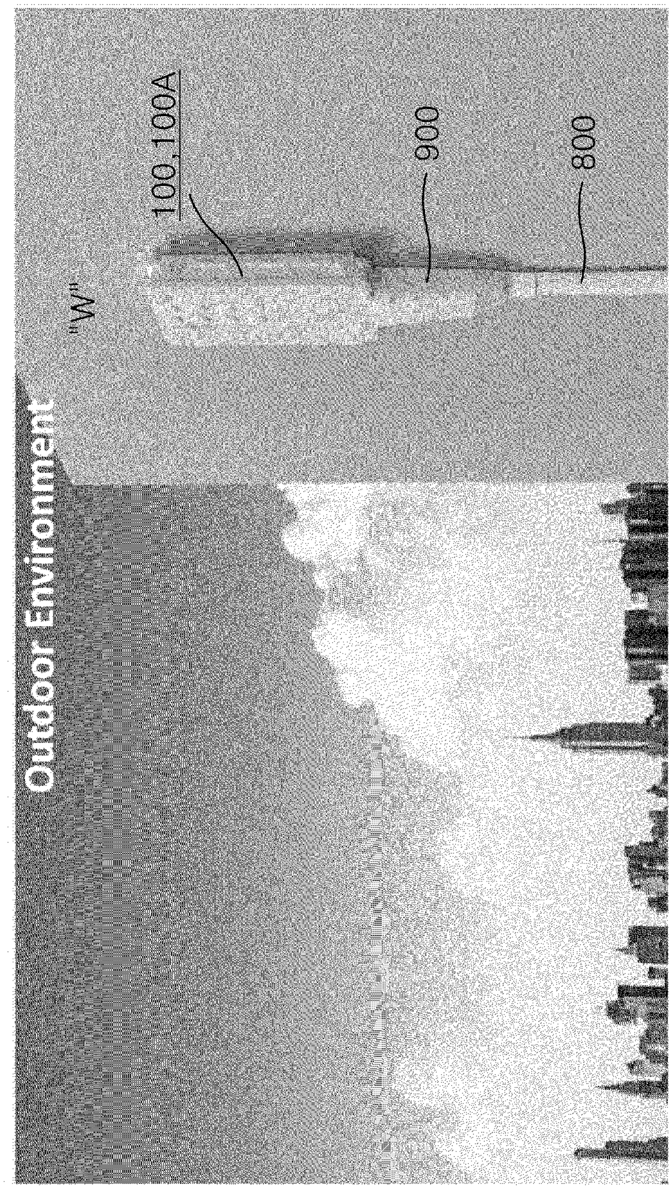

FIGS. 10A to 10C are pictures illustrating various installation examples of the antenna apparatus according to one embodiment of the present disclosure.

In the antenna apparatus 100 according to one embodiment of the present disclosure, since the antenna housing part 110 and 120 may be simply installed by installing the installation plate 600 not only on a perpendicular wall surface of an indoor environment such as airports or subway stations as illustrated in FIGS. 10A, but also on a perpendicular wall surface of an outdoor environment such as outdoor parks or plazas as illustrated in FIGS. 10B and 10C in advance, there is an advantage in that it is possible to improve installation convenience.

In addition, in the antenna apparatus 100 according to one embodiment of the present disclosure, since each of the rear surfaces of the antenna housing part 110 and 120 (i.e., the rear surface of the rear housing cover 120) is installed in surface contact with the indoor or outdoor installation wall surface W via the installation plate 600, there is an advantage in that not only it is possible to greatly reduce the spatial limitation, but also to easily dissipate the system heat generated from the inside of the antenna housing part 110 and 120 to the front surface of the front housing 110 without thermal interference.

Figure 11A:
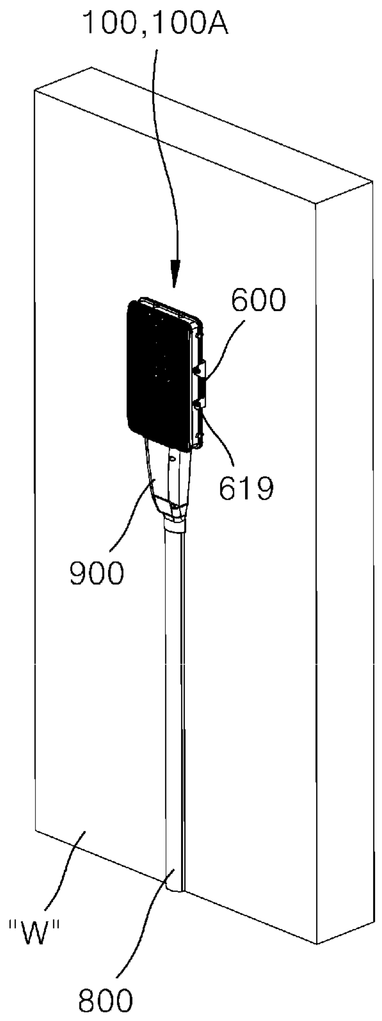
FIG. 11A is a perspective view illustrating a state in which the antenna apparatus according to the first embodiment among the embodiments of FIG. 1 is installed on an installation wall surface.
Figure 11B:
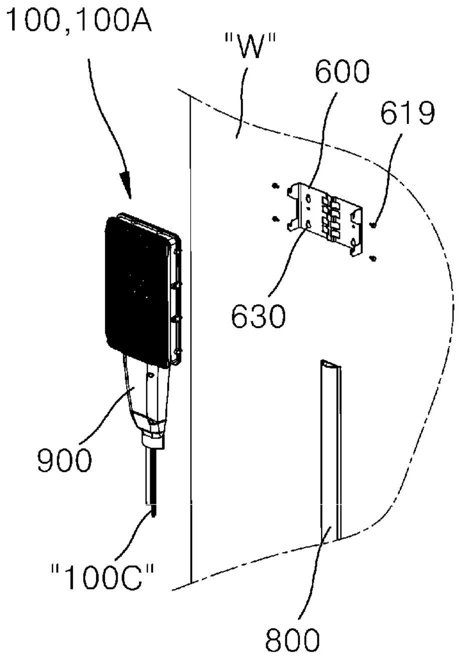
FIG. 11B is an exploded perspective view thereof.
Figure 12A:
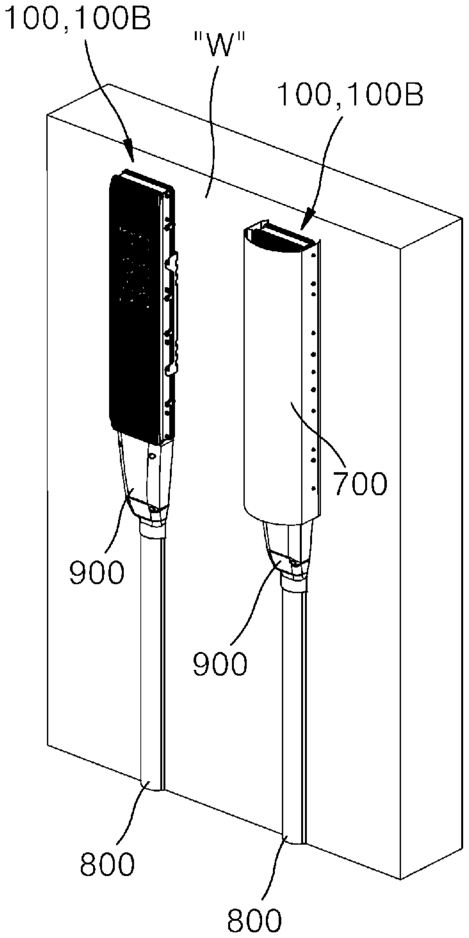
FIG. 12A is a perspective view illustrating a state in which the antenna apparatus according to the second embodiment among the embodiments of FIG. 1 is installed on an installation wall surface.
Figure 12B:
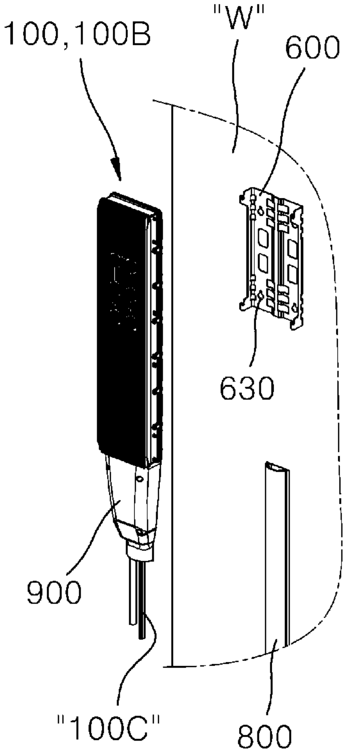
FIG. 12B is an exploded perspective view thereof.
Figure 13A:
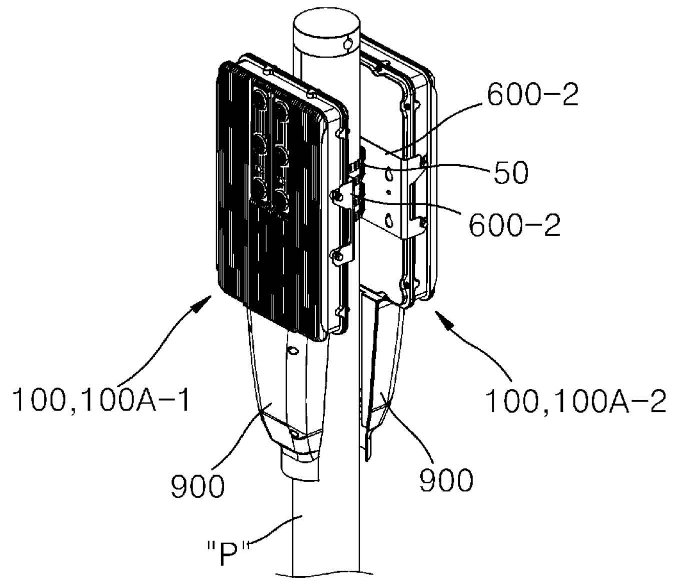
FIG. 13A is a perspective view illustrating a state in which a pair of antenna apparatuses according to the first embodiment among the embodiments of FIG. 1 is installed on a support pole.
Figure 13B:
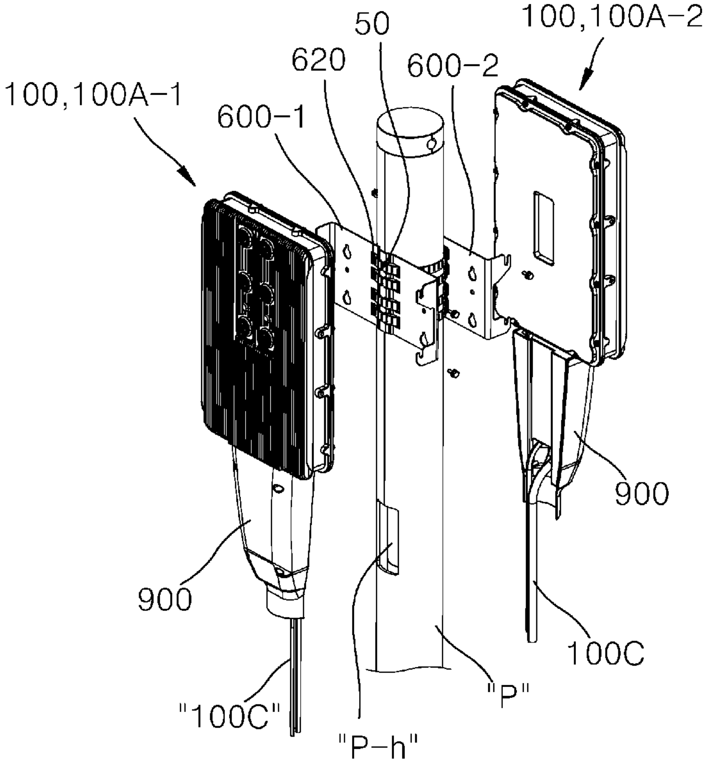
FIG. 13B is an exploded perspective view thereof.
Figure 14A:
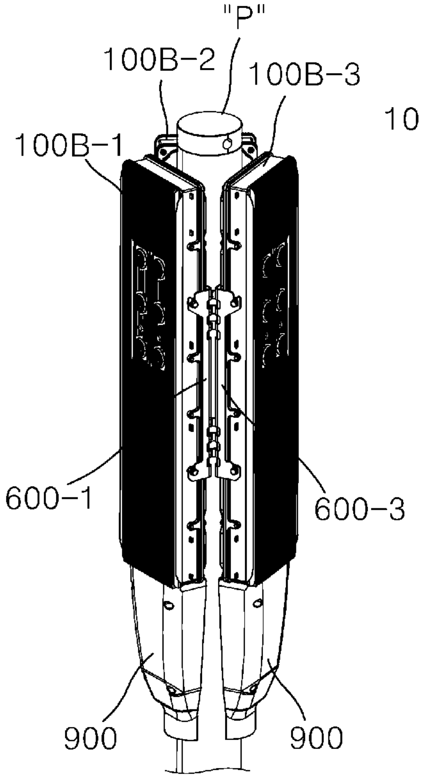
FIG. 14A is a perspective view illustrating a state in which three antenna apparatuses according to the second embodiment among the embodiments of FIG. 1 are installed on the support pole.
Figure 14B:
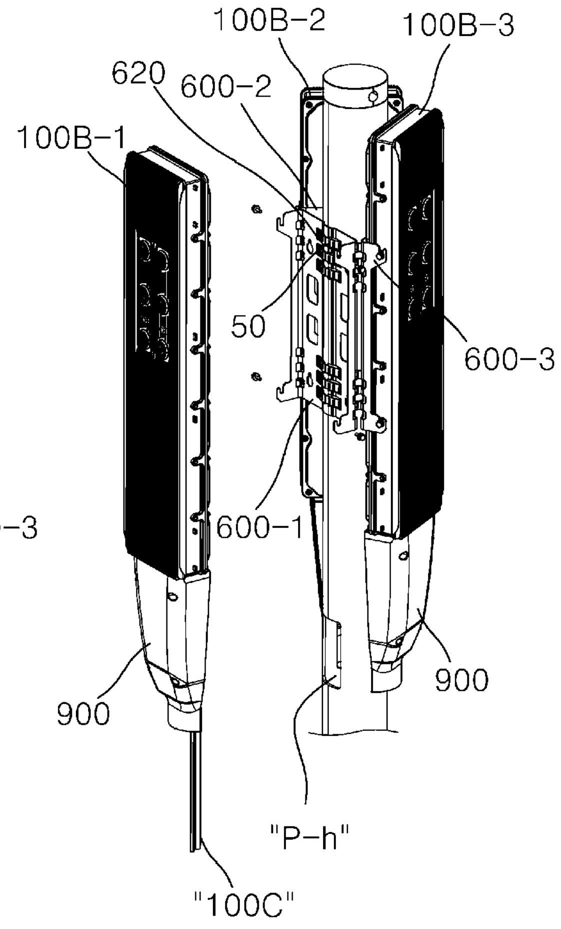
FIG. 14B is an exploded perspective view thereof.

FIG. 11A is a perspective view illustrating a state in which the antenna apparatus according to the first embodiment among the embodiments of FIG. 1 is installed on an installation wall surface, and FIG. 11B is an exploded perspective view thereof, FIG. 12A is a perspective view illustrating a state in which the antenna apparatus according to the second embodiment among the embodiments of FIG. 1 is installed on an installation wall surface, and FIG. 12B is an exploded perspective view thereof, FIG. 13A is perspective view illustrating a state in which a pair of antenna apparatuses according to the first embodiment among the embodiments of FIG. 1 is installed on a support pole, and FIG. 13B is an exploded perspective view thereof, and FIG. 14A is a perspective view illustrating a state in which three antenna apparatuses according to the second embodiment among the embodiments of FIG. 1 are installed on the support pole, and FIG. 14B is an exploded perspective view thereof.

As illustrated in FIGS. 11A to 12B, the antenna apparatuses 100A and 100B according to one embodiment of the present disclosure may be installed on the installation wall surface W via the installation plate 600.

More specifically, as illustrated in FIGS. 11A to 12B, a fixing groove 630 for an installation wall surface, which is formed to pass through the installation plate 600 in the front-rear direction and allows a head portion of an installation screw (not illustrated) previously fixed to the installation wall surface W to be inserted by passing through the installation plate 600 when the installation plate 600 moves rearward, and then allows a body portion of the installation screw to be hooked by being inserted in its own weight direction when the installation plate 600 moves downward, may be formed at a plurality of positions of the installation plate 600.

Here, since the installation screw is generally formed to have a radius of the head portion larger than a radius of the body portion, the fixing groove 630 for an installation wall surface may be formed to be cut so that a circular cutout portion with a size at which the head portion is at least inserted and a circular cutout portion connected to the cutout portion and smaller than the radius of the head portion and larger than the radius of the body portion are connected.

The fixing grooves 630 for an installation wall surface may be formed to be spaced apart from each other at three or more positions (four positions in the present embodiment) so that the flat portion of the installation plate 600 may be stably fixed by being hooked to the installation wall surface W. The head portions of the installation screws previously fixed to the three or four positions of the installation wall surface W may pass through the installation plate 600 forward and then move the installation plate 600 downward so that the body portion of the installation screw may be stably hooked to the fixing groove 630 for an installation wall surface.

As described above, after the installation plate 600 is stably fixed to the installation wall surface W, as illustrated in FIGS. 11A to 12B, the antenna housing part 110 and 120 may be fixed by an operation of fastening the assembly screw 619 through the "U"-shaped screw fastening grooves 615 formed in both left and right end portions of the installation plate 600.

Here, the antenna apparatus 100 according to one embodiment of the present disclosure may further include an external mounting member 400 provided on a lower end portion of the antenna housing part 110 and 120 and for terminal connection with an external cable 100C for supplying external power or signals.

In addition, as illustrated in FIGS. 11A to 12B, the antenna apparatus 100 according to one embodiment of the present disclosure may further include a cable installation pipe 800 for guiding the hidden installation of the external cable 100C on the installation wall surface W and a cable hidden cover 900 for hiding the external cable 100C.

As described above, according to the antenna apparatus 100 according to one embodiment of the present disclosure, by hiding the external cable 100C and the external mounting member 400 when the antenna housing part 110 and 120 are installed on the installation wall surface W, it is possible to prevent a degradation in exterior beauty due to the external cable 100C and the external mounting member 400 exposed to the outside.

Meanwhile, as illustrated in FIGS. 13A to 14B, the antenna apparatus 100 according to one embodiment of the present disclosure may be installed via the installation plate 600 so that the rear surface of the rear housing cover 120 is parallel to the longitudinal direction of the support pole P.

Here, a fixing groove 620 for a support pole, which is formed to pass through the installation plate 600 in the front-rear direction and to which a plurality of hose clamp wires 50 provided to be vertically spaced apart from each other to horizontally surround an outer circumferential surface of the support pole P are fastened by being hooked, may be formed at a plurality of positions of the installation plate 600.

As illustrated in FIGS. 13A and 13B, in the case of the installation of the support pole P on the antenna housing part 110 and 120, two installation plates 600-1 and 600-2 may each be installed at the same height to be parallel to the longitudinal direction of the support pole P. In other words, the two installation plates 600-1 and 600-2 may be provided so that front surfaces of front housings 110 of antenna housing parts 110 and 120 face a 180-degree direction with respect to the support pole P.

However, only two antenna apparatuses 100A-1 and 100A-2 should not be necessarily installed on one support pole P, and as illustrated in FIGS. 14A and 14B, front surfaces of front housings 110 of the three antenna apparatuses 100B-1, 100B-2, and 100B-3 may be provided to face a 120-degree direction.

As described above, the antenna apparatus according to one embodiment of the present disclosure has been described in detail with reference to the accompanying drawings. However, it goes without saying that the embodiments of the present disclosure are not necessarily limited by the above-described embodiments, and various modifications and implementation within the equivalent scope are possible by those skilled in the art to which the present disclosure pertains. Therefore, the true scope of the present disclosure will be determined by the claims to be described below.

INDUSTRIAL APPLICABILITY

The present disclosure provides an antenna apparatus capable of reducing the restraint of an installation space for an indoor or outdoor installation wall surface and a support pole, removing a configuration of a conventional radome itself restricted to heat dissipation performance, and enabling forward heat dissipation through one component of an antenna element assembly.

The invention claimed is:

1. An antenna apparatus comprising:

an antenna housing part made of a thermally conductive material and including a front housing formed in a shape of an enclosure with an open rear portion and a rear housing cover shielding the open rear portion of the front housing and forming a predetermined installation space therein;

a main board and a power supply unit (PSU) board disposed to be stacked in the installation space of the antenna housing part, having a predetermined heating element disposed by being mounted on front surfaces thereof, and stacked so that a front surface of the predetermined heating element is in thermal contact with a front inner surface of the installation space of the antenna housing part; and a plurality of filters disposed to form a predetermined layer in the installation space between rear surfaces of the main board and the PSU board and the rear housing cover, wherein a plurality of radiation elements configured to enable implementation of beam forming according to double polarization are exposed to outside air and disposed to form a layer, which differs from the main board, the PSU board, and the plurality of filters, on the front surface of the antenna housing part.

2. The antenna apparatus of claim 1, wherein a plurality of forward heat dissipation fins protruding forward by a predetermined length are formed integrally on a front surface of the front housing corresponding to the front inner surface of the installation space of the antenna housing part in contact with a front surface of the predetermined heating element.

3. The antenna apparatus of claim 1, wherein the antenna housing part is fixed via an installation plate provided so that a rear surface of the rear housing cover is installed parallel to an installation wall surface.

4. The antenna apparatus of claim 3, wherein the rear housing cover of the antenna housing part is formed flat to be in surface contact with the installation plate.

5. The antenna apparatus of claim 3, wherein the installation plate is formed in a perpendicular panel shape in surface contact with the installation wall surface and made of a thermally conductive material capable of conducting heat transferred from the rear housing cover.

6. The antenna apparatus of claim 3, wherein a fixing groove for an installation wall surface, which is formed to pass through the installation plate in a front-rear direction and allows a head portion of an installation screw previously fixed to the installation wall surface to be inserted by passing through the installation plate when the installation plate moves rearward, and then allows a body portion of the installation screw to be hooked by being inserted in its own weight direction when the installation plate moves downward, is formed at a plurality of positions of the installation plate.

7. The antenna apparatus of claim 3, wherein a left and right antenna hooking part bent to protrude forward is formed on each of both left and right end portions of the installation plate, a "U"-shaped screw fastening groove with an open upper portion is formed in each of the left and right antenna hooking parts, and the antenna housing part is fixed by being hooked by an operation in which an assembly screw is fastened by being inserted into and hooked to a screw fastening groove when fastened to the screw fastening hole of screw fastening parts formed on left and right edge side surface portions of the front housing of the antenna housing part.

8. The antenna apparatus of claim 7, further comprising a light emitting diode (LED) module coupled to surround a front surface of the antenna housing part and configured to radiate predetermined light from both side surface portions thereof, wherein the LED module is fastened to the remaining screw fastening holes other than a screw fastening hole to which the installation plate is screw-fastened by the assembly screw by a separate assembly screw.

9. The antenna apparatus of claim 8, wherein the LED module further includes:

an LED board part on which a plurality of LED elements disposed to extend vertically inside both left and right side surface portions of the LED module are mounted; and an LED guide part disposed vertically inside the both left and right side surface portions of the LED module and configured to prevent light generated from the LED elements from entering a rear side provided with the antenna housing part.

10. The antenna apparatus of claim 8, wherein left and right sides inside upper and lower end portions of the LED module are provided with a detachable guide part in which a "U"-shaped assembly guide groove open rearward is formed, and a guide screw hole to which a guide screw passing through the detachable guide part is assembled is formed in upper and lower end portions of the front housing of the antenna housing part.

11. The antenna apparatus of claim 1, wherein the antenna housing part is fixed via an installation plate provided so that a rear surface of the rear housing cover is installed parallel to a longitudinal direction of a support pole.

12. The antenna apparatus of claim 11, wherein a fixing groove for a support pole, which is formed to pass through the installation plate in a front-rear direction and to which a plurality of hose clamp wires provided to be vertically spaced apart from each other to horizontally surround an outer circumferential surface of the support pole are fastened by being hooked, is formed at a plurality of positions of the installation plate.

13. The antenna apparatus of claim 11, wherein a left and right antenna hooking part bent to protrude forward is formed on each of both left and right end portions of the installation plate, a "U"-shaped screw fastening groove with an open upper portion is formed in each of the left and right antenna hooking parts, and the antenna housing part is fixed by being hooked by an operation in which an assembly screw is fastened by being inserted into and hooked to a screw fastening groove when fastened to the screw fastening hole of screw fastening parts formed on left and right edge side surface portions of the front housing of the antenna housing part.

14. The antenna apparatus of claim 1, wherein an element seating part on which an antenna element assembly including the plurality of radiation elements is seated is provided flat on a front surface of the front housing of the antenna housing part.

15. The antenna apparatus of claim 14, wherein the element seating part is formed so that a front surface of the front housing of a portion from which the plurality of forward heat dissipation fins are removed is recessed to a predetermined depth and formed to a depth at which an edge end portion of the antenna element assembly is accommodated deeper than front ends of the plurality of forward heat dissipation fins.

16. The antenna apparatus of claim 14, wherein the antenna element assembly includes:

a printed circuit board for a radiation element coupled in close contact with a front surface of the element seating part;

an antenna patch circuit part formed by being printed on a front surface of the printed circuit board for a radiation element;

an antenna assembly cover made of a plastic resin material and configured to shield the front surface of the printed circuit board for a radiation element including the antenna patch circuit part; and a plurality of radiation directors made of a thermally conductive material, disposed on a front surface of the antenna assembly cover, and each electrically connected to the antenna patch circuit part through one of a plurality of through holes formed to pass through the antenna assembly cover in a front-rear direction.

* * * * *